United States Patent
Masluk

(10) Patent No.: US 12,426,209 B2
(45) Date of Patent: Sep. 23, 2025

(54) NON-CONTACT THERMAL RADIATION SHIELD INTERFACE

(71) Applicant: INTERNATIONAL BUSINESS MACHINES CORPORATION, Armonk, NY (US)

(72) Inventor: Nicholas A. Masluk, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 283 days.

(21) Appl. No.: 17/934,194

(22) Filed: Sep. 21, 2022

(65) Prior Publication Data

US 2024/0098939 A1    Mar. 21, 2024

(51) Int. Cl.
*H05K 7/20*    (2006.01)
*G06N 10/40*    (2022.01)

(52) U.S. Cl.
CPC ......... *H05K 7/20372* (2013.01); *G06N 10/40* (2022.01)

(58) Field of Classification Search
None
See application file for complete search history.

(56) References Cited

U.S. PATENT DOCUMENTS

| | | | |
|---|---|---|---|
| 2,195,077 A * | 3/1940 | Brown | F17C 1/12 62/46.1 |
| 4,267,707 A | 5/1981 | Hemmerich | |
| 7,233,501 B1 | 6/2007 | Ingalz | |
| 7,389,645 B2 | 6/2008 | Ritchie | |
| 10,648,737 B2 | 5/2020 | Lonardi et al. | |
| 2007/0101733 A1 | 5/2007 | Ritchie | |
| 2009/0280050 A1 | 11/2009 | Ravi et al. | |
| 2013/0239621 A1 | 9/2013 | Ferry | |
| 2017/0198971 A1 | 7/2017 | Lonardi et al. | |
| 2021/0350270 A1 | 11/2021 | Jones et al. | |
| 2022/0092459 A1 * | 3/2022 | Bogorin | G06N 10/00 |

FOREIGN PATENT DOCUMENTS

| | | | | |
|---|---|---|---|---|
| FI | 20245328 A1 * | 3/2025 | | F17C 3/085 |
| WO | WO-2023156801 A1 * | 8/2023 | | F25B 9/10 |

OTHER PUBLICATIONS

Axline, C. et al., "On-Demand Quantum State Transfer and Entanglement Between Remote Microwave Cavity Memories"; arXiv:1712.05832v1 (2017); 23 pgs.

* cited by examiner

*Primary Examiner* — Jenna M Maroney
(74) *Attorney, Agent, or Firm* — Amin, Turocy & Watson, LLP

(57) ABSTRACT

A thermal radiation shield interface for cryogenic systems includes a first element with a distal, free end. Flanges project from the distal, free end of the first element. A second element also includes a distal, free end. Flanges project from the distal, free end of the second element. The flanges of the first element and the flanges of the second element are positioned in an interleaved arrangement to cover an opening between the first element and the second element shielding the opening from radiation leakage.

19 Claims, 6 Drawing Sheets

NON-CONTACT THERMAL RADIATION SHIELD INTERFACE

BACKGROUND

Technical Field

The present disclosure generally relates to cryogenic devices, and more particularly, to non-contact thermal radiation shield interfaces.

Description of the Related Art

In cryogenic applications, dilution refrigerators are often used. A typical dilution refrigerator may use nested stages of chambers, with the payload being cooled placed in the innermost chamber. The innermost stage is also typically the coldest chamber. Thermal radiation shielding is a salient component to reduce loading on colder stages. The thermal shielding helps to achieve the appropriately low temperatures as stages transition from one stage to the next, avoiding heating the device(s) meant to be cooled. This is generally achieved by enclosing each cooling stage with metal shields thermally coupled to the preceding stage. To minimize radiation leakage between stages, holes and seams are covered to make stages relatively light-tight.

The typical usage of radiation shielding results in potential limitations within a cryogenic environment. For example, conventional shielding often uses static or fixed seals. Since seals are generally immobile, they are unsuitable for use on a moving element. This poses limitations in the construction of an experimental setup or quantum computing system that would benefit from some form of mobility for a particular application since moving parts would involve mechanical breaks in shielding attached to those parts. Breaks in the shielding may provide a path for light leaks that contribute to thermal radiation seeping into internal stages.

In another example of an application that is limited by the use of static seals, some sections of a dilution refrigerator may include, for example, plates or shields that are to be kept at different temperatures. To provide thermal decoupling between elements also involves physical breaks, and the resultant gaps allow for light leaks into different stages.

One current approach to introduce motion within the inner-most chamber of a dilution refrigerator uses a micro positioner located at the mixing chamber stage. Such systems are designed to provide motion at low temperature, with the entirety of the actuator placed within the shielded environment. Another system that is under development utilizes stages that are on the same plane but use independent cryocoolers with weak thermal coupling between stage plates to allow varied heat loads and temperatures on a common plane.

SUMMARY

According to an embodiment of the present disclosure, a thermal radiation shield interface for cryogenic systems is provided. The thermal radiation shield includes a first element with a distal, free end. Flanges project from the distal, free end of the first element. A second element also includes a distal, free end. Flanges project from the distal, free end of the second element. The flanges of the first element and the flanges of the second element are positioned in an interleaved arrangement to cover an opening between the first element and the second element.

In one embodiment, the flanges of each element are spaced to provide a contactless relationship. By positioning the flanges so that they are not in contact, the interface may preserve features such as thermal decoupling of stages to prevent unintended thermal conduction across decoupled stages, while avoiding light leaks that would allow radiation from an outer stage to an inner stage. The efficiency of a system is maintained and, in some instances, improved since radiation leakage into an inner stage is prevented.

According to an embodiment of the present disclosure, a dilution refrigerator is provided. The dilution refrigerator includes a first chamber and a second chamber nested within the first chamber. A first element is connected to the first chamber and a second element is connected to the second chamber. An interface of the first element to the second element includes an opening shared between the first chamber and the second chamber. A thermal radiation shield covers the opening. The thermal radiation shield includes a distal, free end of the first element and one or more flanges projecting from the distal, free end of the first element. The thermal radiation shield also includes a distal, free end of the second element, and one or more flanges projecting from the distal, free end of the second element. The flanges of the first element and the flanges of the second element overlap and cover the opening between the first chamber and the second chamber.

In one embodiment, either the first element or the second element is mobile. By making the elements mobile, the thermal radiation shield allows for some parts of the system to move, providing more options in the construction of the overall system. Meanwhile the shield does not require a seal to be broken while still protecting different parts of the refrigerator from radiation leakage.

According to an embodiment of the present disclosure, a quantum computing device is provided. The quantum computing device includes a quantum processor (including one or more qubit chips), a dilution refrigerator, and a plurality of stages in the dilution refrigerator. The plurality of stages includes a first stage and a second stage. The device also includes an interface of the first stage to the second stage. The interface includes an opening shared between the first stage and the second stage. A first flange is coupled to the first stage. A second flange is coupled to the second stage and disconnected from the first stage. The first flange overlaps the second flange, covering the opening.

In one embodiment, the quantum computing device includes rotation in one of the elements so that either the first flange or the second flange rotates around a central axis. As may be appreciated, rotation on the elements allows for more functionality in the device (including for example, motor driven parts). The rotation feature can be part of the thermal shield when using for example, a circular flange that maintains its overlapping position with the other flange.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1:
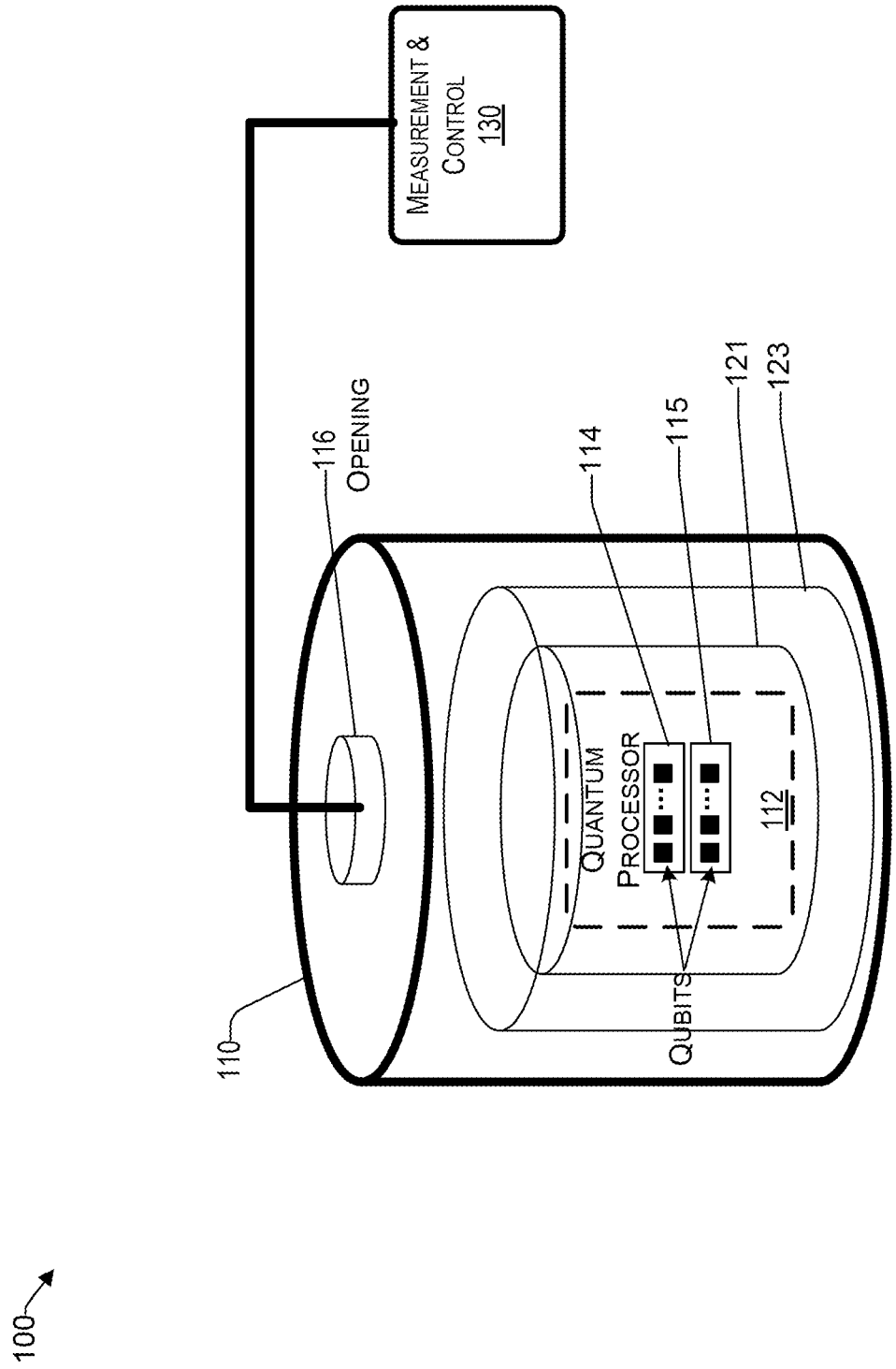
FIG. 1 illustrates an example architecture of a quantum computing system, consistent with an illustrative embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

Definitions

As used herein, the term "interleave" and its variations means an element is arranged in alternating layers, where layers extend from (e.g., project) from opposing sources.

As used herein, a "gasket" or "seal" refers to interleaved elements shielding an opening between stages or plates of a cryogenic device.

As used herein, the terms "lateral", "planar", and "horizontal" describe an orientation parallel to a first surface of a chip or substrate.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

Referring to the Figures, embodiments of the subject technology provide a thermal shielding interface, generally used in a cryogenic environment, for low temperature physics or quantum computing devices. The interface includes at least two elements that are distinct mechanical features, cooperating to shield one side of the interface from another side of the interface. The elements may not be in physical contact with each other, and in some embodiments, are mobile. As will be appreciated, the cooperative arrangement of the interface elements provides an elongated light path at the opening in the interface. Any light that travels into the interface is absorbed by the material in the opening, minimizing, if not completely eliminating any radiation that is moving from one stage of the device to another stage.

Example Architecture

FIG. 1 illustrates an example architecture 100 of a quantum computing system, consistent with an illustrative embodiment. The architecture 100 may include a quantum processor 112 comprising one or more chips 114, 115. Each chip (114, 115) can include a plurality of qubits. The quantum processor 112 is located in a refrigeration unit 110, which may be a dilution refrigerator. A dilution refrigerator is a cryogenic device that provides continuous cooling to temperatures typically 10 mK on its bottom temperature stage 121 (that houses the quantum processor 112). Some support circuitry may located be at a higher temperature stage 123, which may be at 4K.

In one embodiment, the dilution refrigerator system 110 may comprise several stages/plates that have different temperatures, for example 300 K at the top of the fridge (room temperature). The other stage/plate temperatures of 40 K, 4 K, 0.7K, 0.1K, and 0.01 K are inside the fridge in vacuum. There are shields (not shown in FIG. 1 but are described more fully below) that are attached to the interfaces of different temperature stages and/or to moving elements.

Most of the physical volume of the architecture 100 is due to the large size of the refrigeration unit 110. To reach the millikelvin temperatures at which the system operates, the refrigeration unit 110 may use liquid helium as a coolant or helium pulse tube in conjunction with a dilution refrigeration unit.

There is a measurement and control unit 130 that is outside of the refrigeration system 110. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. In some embodiments, a seal of the subject disclosure may be present in the opening 116.

Accordingly, in one aspect, what is provided herein is an architecture 100 that can reduce the transfer of thermal radiation between stages or plates in a dilution refrigerator 110. In another aspect, the architecture 100 allows for moving parts to be present, which in some embodiments, are positioned at an opening or interface of two stages or plates.

Example Block Diagrams

Figure 2A:
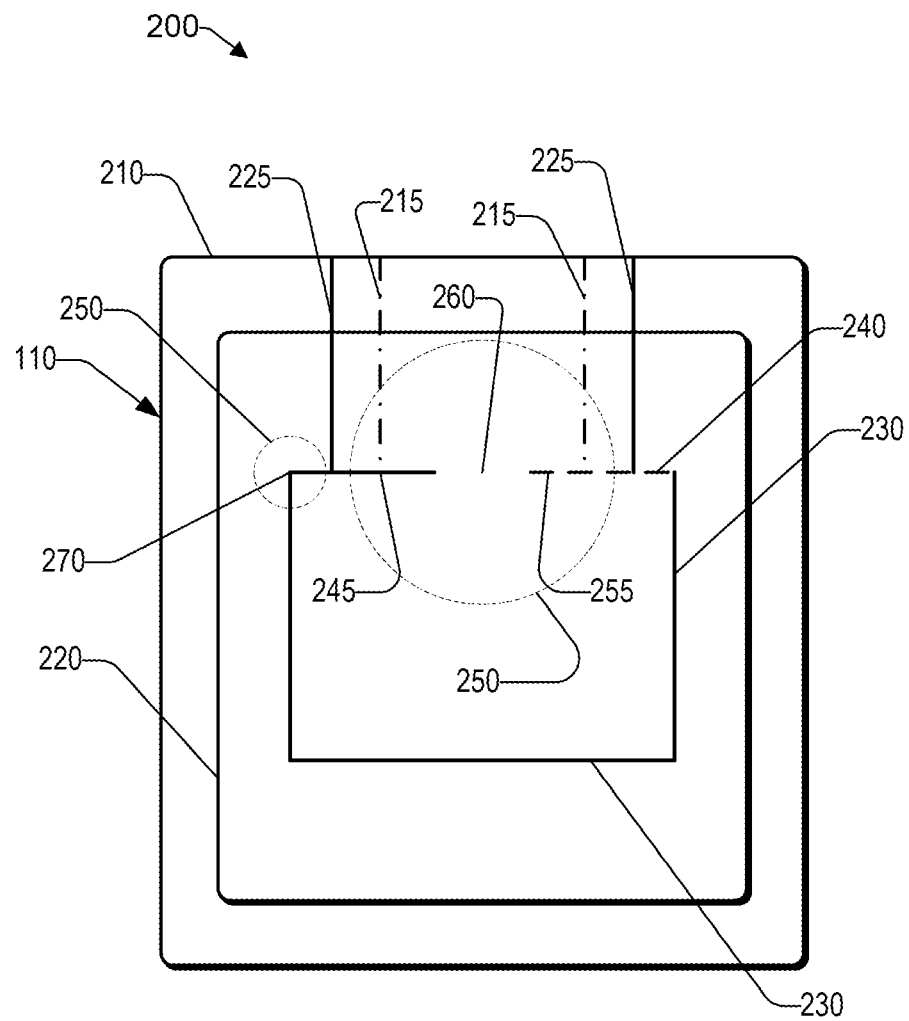
FIG. 2A is a diagrammatic, cross-sectional, side view of a section of stages in a dilution refrigerator of a quantum computing device, according to an embodiment.
Figure 2B:
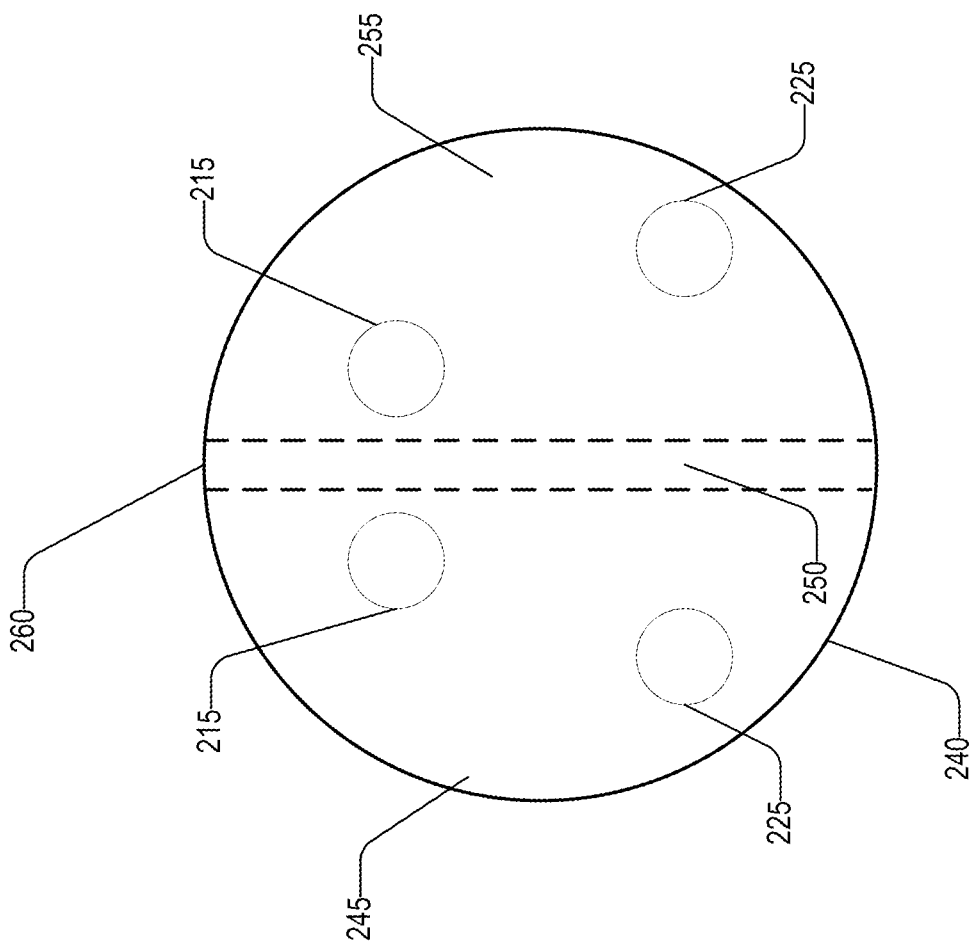
FIG. 2B is a diagrammatic top view of a plate including openings between two stage areas according to an embodiment.

Reference now is made to FIG. 2A and FIG. 2B. FIG. 2A shows a conceptual block diagram of a section of a dilution refrigerator architecture 200 that provides non-contact thermal radiation shielding at various interfaces of stages or plates, consistent with an illustrative embodiment. It should be understood that the architecture shown in FIG. 2A may represent only a section of a dilution refrigerator, and that dilution refrigerators may include more stages and more parts than what is depicted. For example, a dilution refrigerator may include the following stages (ordered from warmest to coldest): a first pulse tube stage, a second pulse tube stage, a still, a cold plate, and a mixing chamber. For sake of illustration, however, only three stages are shown in the architecture 200. In addition, the architecture 200 is only a representation of stages/platforms and highlights areas where interfaces that may have an opening (and consequently, are a potential source for radiation leakage) may be present. The actual interface structures may differ from the simplified drawing shown. Examples in detail are provided further below as disclosed in FIGS. 2B and 3-5.

The dilution refrigerator architecture 200 shows three stages of nested chambers in a dilution refrigerator 110 (i.e., stages 210, 220, and 230. Support posts 225 may connect the outermost stage 210 to the innermost stage 230 through the intermediate stage 220. Support posts 215 also connect the stages similar to posts 225, except the posts 215 are shown in broken lines to represent being further into the depth of the figure than posts 225. In FIG. 2A, two interfaces 250 (of different types) are highlighted as circled areas. The interfaces 250 are located on the plate 240 of the innermost stage 230.

One interface 250 is located at an opening 260. Two sections of the plate 240, a first section 245 and a second section 255, are separated by the opening 260. In some embodiments, (for example, as shown in FIG. 2B), the opening 260 may extend diametrically from one point of the plate 240 to the opposite point of the plate 240, and in some embodiments, splitting the plate 240 in half. In other embodiments, the opening may be a slit, circular, or similar. In FIG. 2A, the opening 260 is shown uncovered. In FIG. 2B, the opening 260 is covered by the interleaved parts from sections 245 and 255 of the interface 250. In some embodiments, the first section 245 is thermally decoupled from the second section 255 (represented by different line patterns in FIG. 2A). The other interface 250 is shown being located at the "corner" 270 of the first plate section 245 and the interior of stage 220. Other interfaces and seals of the subject technology may be present where the posts 215 and/or 225 meet or pass through one of the stages 210, 220, or 230.

Figure 3:
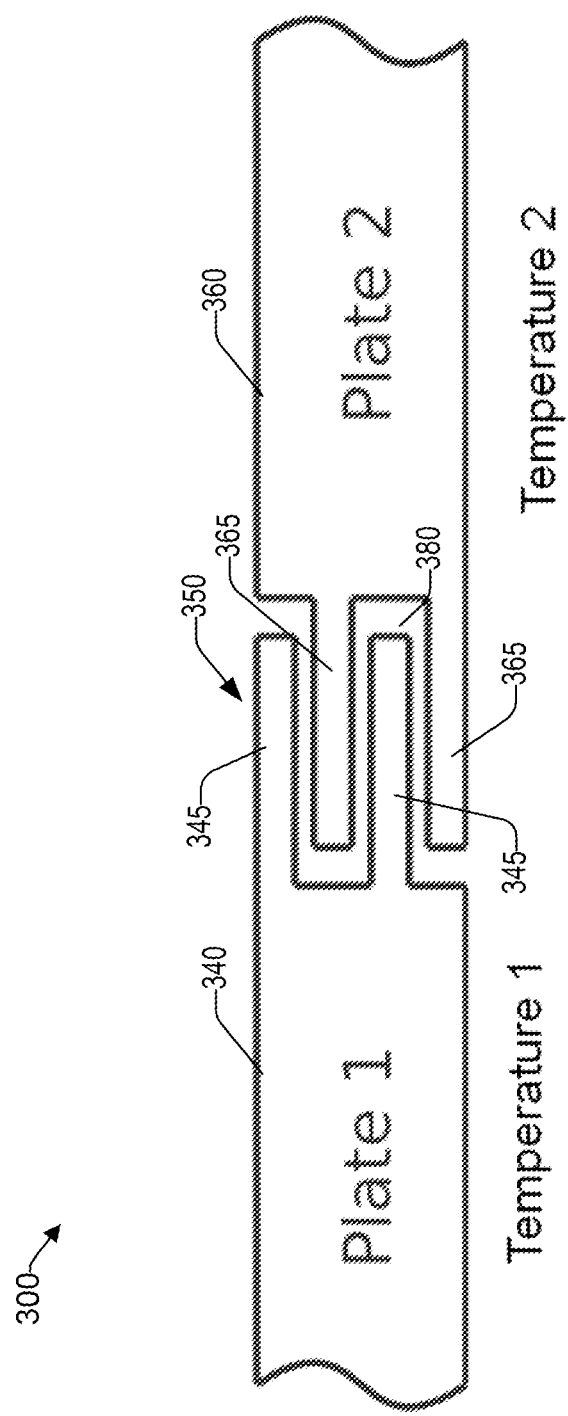
FIG. 3 is an enlarged, diagrammatic side view of a surface interface in the circle 3 of FIG. 2, according to an embodiment.

Referring now to FIG. 3, an interface 300 is shown according to an embodiment. The interface 300 includes two elements that cooperate so that their respective surfaces are not in contact, yet are positioned to generally cover an opening so that light or any other radiation cannot travel straight through the opening. In an embodiment illustrative of the subject interface, a plate (or plate section) 340 is joined in non-contact with a plate (or plate section) 360. The plate 340 and the plate 360 may be features that form an interleaved joint 350. The interleaved joint 350 is one example of a thermal radiation shield interface of the subject technology. The interleaved joint 350 may be formed in a plane common to both the plate 340 and the plate 360. The "joint" in this context means that the features of plate 340 overlap with the features of plate 360 to cover the opening and does not necessarily mean that any physical contact between the plate 340 and the plate 360 occurs. For example, the plate 340 includes a pair of flanges or projections 345 whose distal ends extend into spaces defined by flanges or projections 365 of the plate 360 so that the flanges 345 are parallel with the flanges 365 and occupying the same space in an opening. The arrangement of flanges 345 and 365, when interleaved, define a light path 380 in the spacing between the flanges that may wind back and forth multiple times. Any radiation that is incident on the interleaved joint 350 must reflect several times between the surfaces of the flanges 345 and 365. In all likelihood, energy that propagates through the light path 380 will increasingly diminish as some of the radiation from each reflection is absorbed by the flanges' material. While each plate 340/360 was shown having a pair of flanges, it will be understood that the number of flanges may be uneven and, in some embodiments, may be increased to increase the light path 380.

As will be appreciated, the interface 300 opens up multiple mechanical options in a cryogenic application. The interface 300 may be used to allow for structures that are at different temperatures while maintaining the integrity of any radiation barrier formed by the structures. FIG. 3 depicts plate 340 being at a different temperature than plate 360. For example, plates 340 and 360 may be two halves of a sectioned stage of a cryostat, with separate cryocoolers used on 340 and 360, allowing different thermal powers to be dissipated at each section while minimally disturbing the neighboring section.

Figure 4:
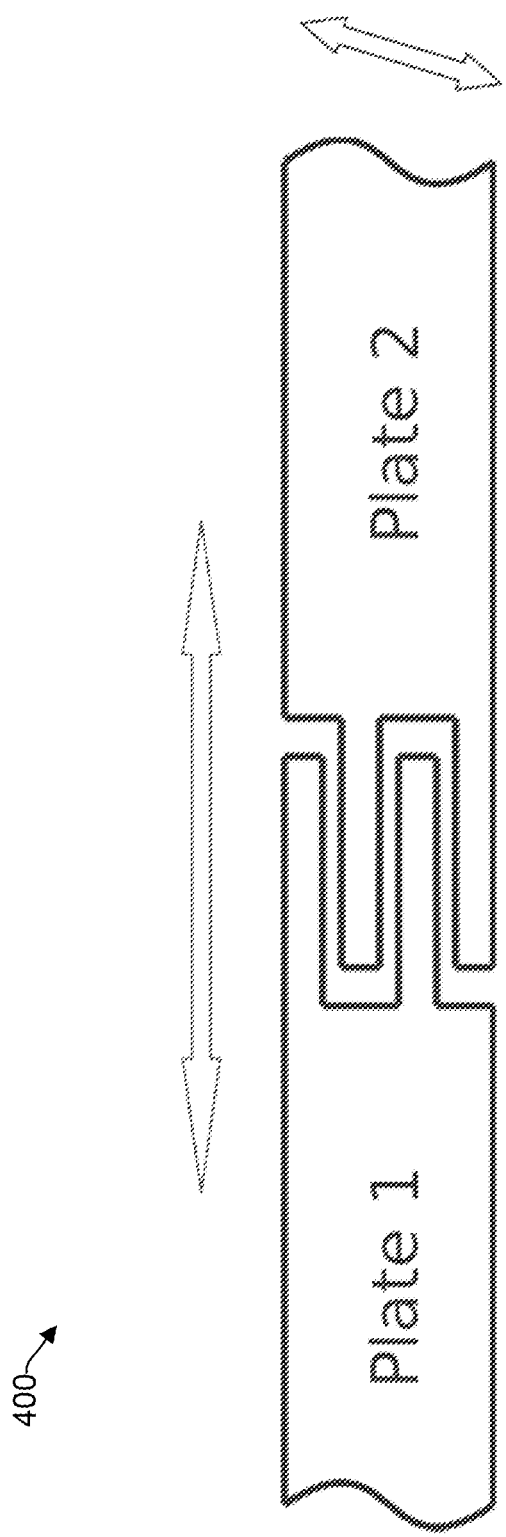
FIG. 4 is a diagrammatic side view of a surface interface depicting directions of linear motion according to an embodiment.

FIG. 4 shows an interface 400 that is similar to the interface 300 except that the plates may move co-directionally (for example, into and out of the page of the figure), or towards/away from each other limited by the depth of cuts in the edge profile that define the flanges.

This linear movement can be deliberate, such as to adjust alignment of components within a system, for example, to (dis)connect communication channels within a system, or adjust coupling between components in a system. The movement of plates can also be the result of thermal contraction and expansion as the system cools down or warms up. For example, a large quantum computer may comprise a large chain of connected cryostats. Each cryostat may thermally contract/expand about its own center while maintaining the integrity of shielding at each temperature stage along the entire system. As will be appreciated, allowing expansion and contraction with protected shielding at transitions may simplify overall mechanical design. Additionally, if each cryostat is only weakly thermally coupled, one cryostat can dissipate a large amount of power and be allowed to raise in temperature without strongly affecting other cryostats in the chain. If strong thermal coupling is desired while still allowing mechanical movement, a flexible thermally conducting member such as a copper braids may be utilized to thermally anchor plates together.

Figure 5:
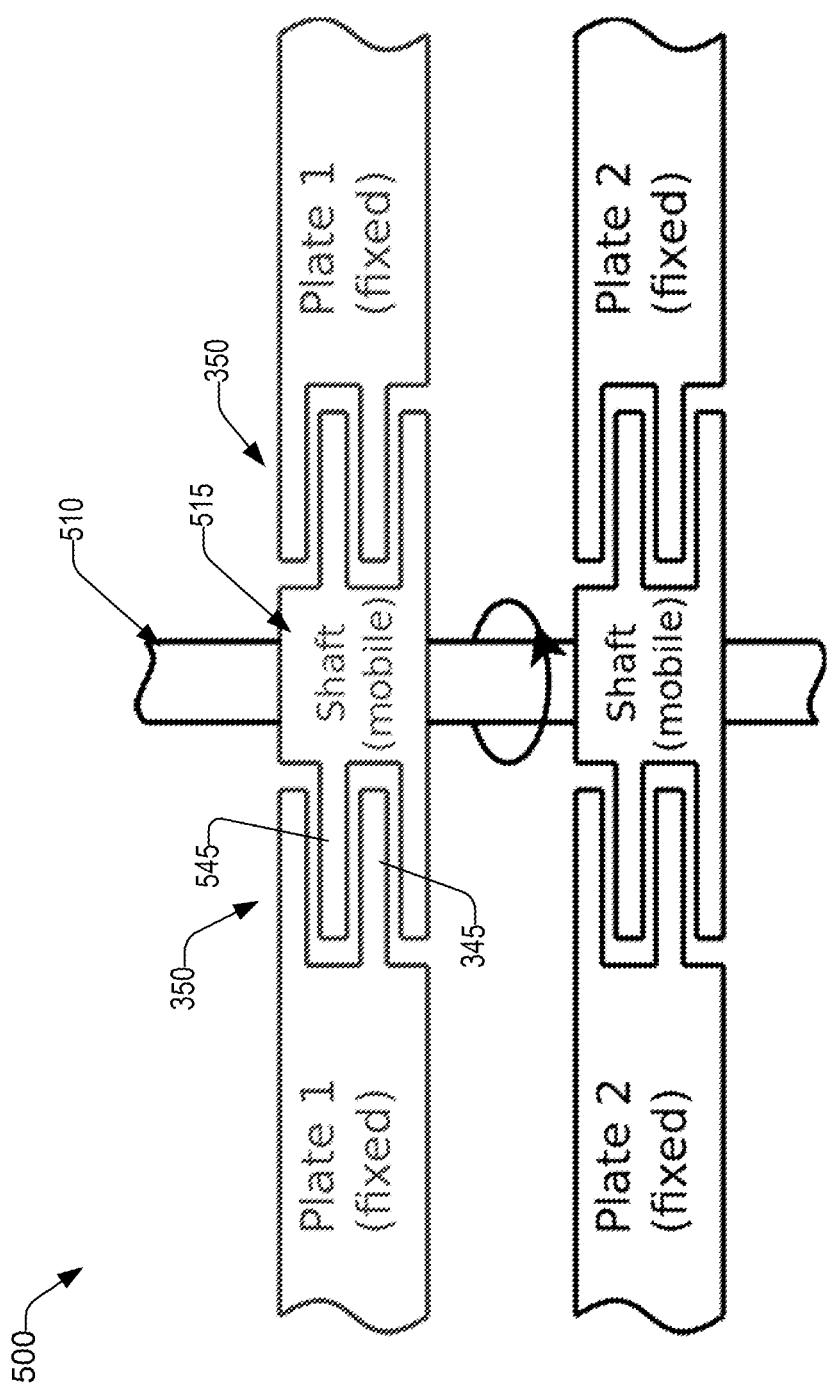
FIG. 5 is a diagrammatic side view of a series of platform interfaces with a rotational component, according to an embodiment.

Reference is now made to FIG. 5, which is similar to the interface 300 except that the additional elements are included to provide for rotational movement in a transition point. The interface 500 is adapted for rotational movement. The interface 500 may include circular flange modules 515 mounted onto a shaft 510. The flange modules 515 may include one or more flanges 545 that are interleaved with flanges 345 similar to the overlapping arrangement shown in FIG. 3 between flanges 345 and 365. In the embodiment shown, the moving elements include the shaft 510 and the flange modules 515 which rotate about a central axis. The plates (or analogous structures) may be fixed. As will be appreciated, the interface 500 provides another example of mobility that becomes available in a cryogenic environment while maintaining radiation shielding between different areas on opposite sides of plates or platforms.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A thermal radiation shield interface for cryogenic systems, comprising:
    a first element including a distal, free end;
    a plurality of flanges projecting from the distal, free end of the first element;
    a second element including a distal, free end;
    a plurality of flanges projecting from the distal, free end of the second element, wherein the plurality of flanges of the first element and the plurality of flanges of the second element are positioned in an interleaved arrangement to cover an opening between the first element and the second element; and a shaft coupled to the second element, wherein the one or more flanges of the second element are configured to rotate through the one or more flanges of the first element.

2. The thermal radiation shield interface of claim 1, wherein the plurality of flanges of the first element are spaced in a contactless relationship to the plurality of flanges of the second element.

3. The thermal radiation shield interface of claim 1, wherein the first element is at a first temperature and the second element is at a second temperature that is different than the first temperature of the first element.

4. The thermal radiation shield interface of claim 1, wherein the second element is configured to move relative to the first element.

5. A thermal radiation shield interface for cryogenic systems, comprising:
   a first element including a distal, free end;
   one or more flanges projecting from the distal, free end of the first element;
   a second element including a distal, free end;
   one or more flanges projecting from the distal, free end of the second element, wherein the one or more flanges of the first element and the one or more flanges of the second element are positioned in an interleaved arrangement to cover an opening between the first element and the second element; and
   a shaft coupled to the second element, wherein the one or more flanges of the second element are configured to rotate through the one or more flanges of the first element.

6. The thermal radiation shield interface of claim 5, wherein the first element is configured to move co-directionally relative to the second element.

7. The thermal radiation shield interface of claim 5, wherein the second element is configured to move linearly toward the first element.

8. A dilution refrigerator, comprising:
   a first chamber;
   a second chamber nested within the first chamber;
   a first element connected to the first chamber;
   a second element connected to the second chamber;
   an interface of the first element to the second element, including an opening shared between the first chamber and the second chamber; and
   a thermal radiation shield covering the opening, the thermal radiation shield including:
   a distal, free end of the first element;
   a plurality of flanges projecting from the distal, free end of the first element;
   a distal, free end of the second element; and
   a plurality of flanges projecting from the distal, free end of the second element, wherein the plurality of flanges of the first element and the plurality of flanges of the second element overlap and cover the opening between the first chamber and the second chamber, wherein either the first element or the second element is rotatable.

9. The dilution refrigerator of claim 8, wherein the one or more flanges of the first element and the plurality of flanges of the second element are in an interleaved arrangement.

10. The dilution refrigerator of claim 8, wherein the plurality of flanges of the first element are spaced in a contactless relationship to the plurality of flanges of the second element.

11. The dilution refrigerator of claim 10, wherein:
    a spacing between the plurality of flanges of the first element to the plurality of flanges of the second element define a light path including multiple reflections; and
    radiation travelling through the light path is absorbed by the first element and the second element.

12. The dilution refrigerator of claim 8, wherein the first chamber is at a first temperature and the second chamber is at a second temperature that is different than the first temperature of the first chamber.

13. The dilution refrigerator of claim 8, wherein either the first element or the second element is mobile.

14. A quantum computing device, comprising
    a quantum processor including one or more qubit chips;
    a dilution refrigerator;
    a plurality of stages in the dilution refrigerator, including a first stage and a second stage;
    an interface of the first stage to the second stage, including an opening shared by the first stage and the second stage;
    a first plurality of flanges coupled to the first stage;
    a second plurality of flanges coupled to the second stage and disconnected from the first stage, wherein the first plurality of flanges overlaps the second plurality of flanges, covering the opening; and
    a shaft coupled to the second element, wherein the second plurality of flanges are configured to rotate through the first plurality of flanges.

15. The quantum computing device of claim 14, wherein the first plurality of flanges is spaced in a contactless relationship to the second plurality of flanges.

16. The quantum computing device of claim 14, wherein the first plurality of flanges is at a first temperature and the second plurality of flanges is at a second temperature that is different than the first temperature of the first plurality of flanges.

17. The quantum computing device of claim 14, wherein either the first plurality of flanges is mobile in the first stage or the second plurality of flanges is mobile in the second stage.

18. A quantum computing device, comprising a quantum processor including one or more qubit chips;
    a dilution refrigerator;
    a plurality of stages in the dilution refrigerator, including a first stage and a second stage;
    an interface of the first stage to the second stage, including an opening shared by the first stage and the second stage;
    a first flange coupled to the first stage;
    a second flange coupled to the second stage and disconnected from the first stage, wherein the first flange overlaps the second flange, covering the opening; and
    a shaft coupled to the second flange, wherein the second flange is configured to rotate around the axis of the shaft.

19. The quantum computing device of claim 18, wherein the first plurality of flanges is configured to move co-directionally relative to the second plurality of flanges.

* * * * *